United States Patent [19]

Braunig et al.

[11] Patent Number: 4,663,830
[45] Date of Patent: May 12, 1987

[54] FORMING DEEP BURIED GRIDS OF IMPLANTED ZONES BEING VERTICALLY AND LATERALLY OFFSET BY MASK MEV IMPLANT

[75] Inventors: Dietrich Braunig; Meinhard Knoll; Joachim Laschinski; Wolfgang Fahrner, all of Berlin, Fed. Rep. of Germany

[73] Assignee: Hahn-Meitner-Institut für Kernforschung Berlin GmbH, Berlin, Fed. Rep. of Germany

[21] Appl. No.: 699,018

[22] Filed: Feb. 7, 1985

[30] Foreign Application Priority Data

Feb. 8, 1984 [DE] Fed. Rep. of Germany ....... 3404834

[51] Int. Cl.[4] .......................................... H01L 21/265
[52] U.S. Cl. .................................. 29/576 B; 29/571; 148/1.5; 148/175; 148/187; 148/DIG. 10; 357/34; 357/38; 357/91
[58] Field of Search .............. 29/576 B, 571; 148/1.5, 148/175, 187; 357/38, 91, 13, 34

[56] References Cited

U.S. PATENT DOCUMENTS

| | | | |
|---|---|---|---|
| 4,113,516 | 9/1978 | Ponczak et al. | 148/1.5 |
| 4,151,540 | 4/1979 | Sanders et al. | 357/34 |
| 4,247,860 | 1/1981 | Tihanyi | 357/23 |
| 4,278,475 | 7/1981 | Bartko et al. | 148/1.5 |
| 4,278,476 | 7/1981 | Bartko et al. | 148/1.5 |
| 4,374,380 | 2/1983 | Temple | 357/13 |

FOREIGN PATENT DOCUMENTS 0030370 6/1981 European Pat. Off. .

OTHER PUBLICATIONS

Temple IEEE Trans. Electron Devices, ED-30, 1983, p. 954.
"Electronic Letter" (Sep. 16, 1976) vol. 12 #19 pp. 486 487 by Barandon et al.
Proc. of 8th Conf. on Solid State Devices (Tokyo 1976) "Jap. Jour. of App. Phy." vol. 16, 1977 Supp. 16-1 pp. 541–544, by Nishizawa et al.
Proc. IEEE, Dec. 1964 "Gridistor-The New Field by Teszner et al.

*Primary Examiner*—Upendra Roy
*Attorney, Agent, or Firm*—McGlew and Tuttle

[57] ABSTRACT

A buried grid structure is produced in a semiconductor material particularly a silicon wafer, while using a metallic grid mask. The buried grid is formed directly within the semiconductor material by contradoping ion implantation by means of a high energy accelerator through the metallic grid mask. The bars or ribs of the metallic grid mask stop the ions passing therethrough so that two vertically separated and laterally offset buried grid structures are produced. By beveling the periphery of the wafer, buried conductive structures are formed at the same time as connections between the buried grid structures and a control electrode provided on the back side of the wafer.

7 Claims, 6 Drawing Figures

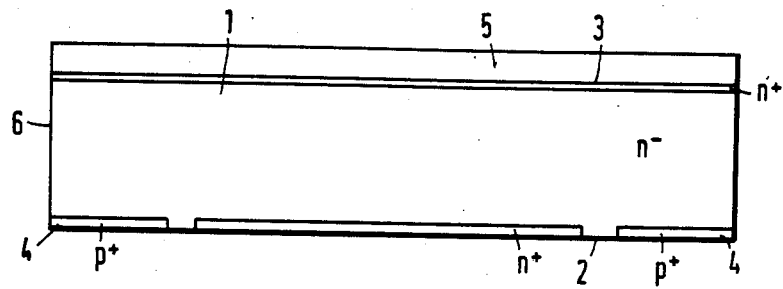
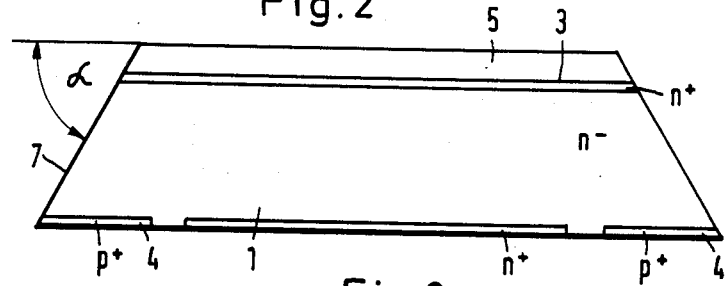
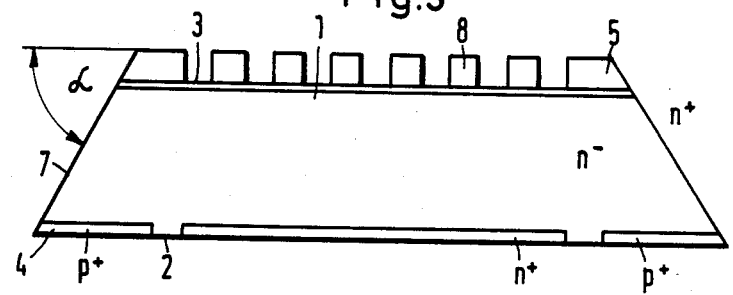
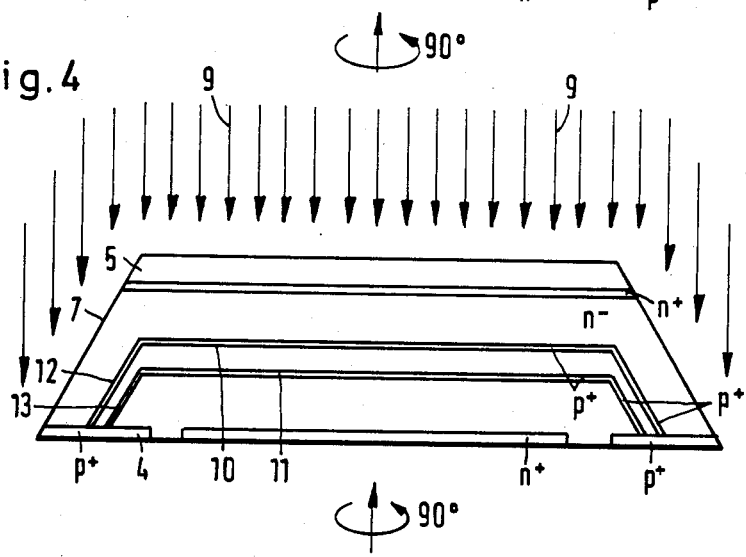

FORMING DEEP BURIED GRIDS OF IMPLANTED ZONES BEING VERTICALLY AND LATERALLY OFFSET BY MASK MEV IMPLANT

FIELD AND BACKGROUND OF THE INVENTION

The present invention relates to a semiconductor power device, particularly a thyristor or gridistor, and to a method of fabricating such a component.

Two kinds of grid structures are known for semiconductor power devices, namely the surface grid structure and the buried grid structure (see *IEEE Transactions on Electron Devices*, Vol. ED-27, No. A, Nov. 1980, pages 2141 to 2145). To fabricate the semiconductor power component with a buried grid structure, an n⁻ doped semiconductor material, such as a silicon wafer, is provided on its surface with a masking layer produced by thermal oxidation. Windows are etched into the marginal areas of the wafer, through which the connections for the grid are produced by planar boron diffusion. At the same time, within the same boron diffusion cycle, a p+ anode is produced on the underside of the wafer. Thereupon a pattern corresponding to a metallic grid mask is produced by etching of the oxide mask in the active area of the wafter. The grid is then produced at the wafer surface by boron diffusion between the bars of the grid. Further, a window is etched out of the oxide mask, substantially above the entire area of the surface grid structure thus formed, in which an n+ doped layer is grown thereover by silicon liquid phase epitaxy. A buried grid structure is thus obtained in the semiconductor wafer. In further working steps, the not yet covered peripheral areas of the grid structure are provided with conducting connections by contact metallization.

With this prior art method, for example, during the fabrication of a gridistor, a contradoped conductive grid, by vacuum tube analogy, is introduced into the semiconductor. A plurality of masking and etching operations is needed for this purpose, since epotaxy requires an array of contradoping material on the semiconductor surface and a subsequent growth of the basic material thereover by further epitaxy, to transform the array into a buried grid structure. The prior art method requires too many working steps, and is therefore very expensive.

SUMMARY OF THE INVENTION

The present invention is directed to a method of the above mentioned kind requiring a minimum of masking and etching operations to produce a buried grid structure in a semiconductor material, particularly a silicon wafer.

Accordingly, an object of the present invention is to provide a method of fabricating a semiconductor power component, particularly a thyristor or gridistor, by introducing into a semiconductor substrate, particularly a silicon wafer, burried grid structure, and using a metallic grid mask, characterized in that the buried grid structure is reproduced directly within the semiconductor substrate by contradoping ion implantation through the metallic grid mask, by a high energy accelerator.

This requires a single masking step, namely the etching of a metallic grid mask out of a metallic layer covering an oxide surface of the semiconductor material. Due to the inventive contradoping ion implantation through the metallic grid mask, a buried grid can be formed directly within the semiconductor material. The mask permits an ion implantation only between the bars of the metallic grid. Since the grid is to be produced at a depth of more than 10 μm, preferably more than 50 μm, the use of a high energy accelerator of the 100 MeV range is necessary.

The wire thickness in the depth direction, i.e. in the direction of implantation, of the buried grid is determined by the physical limits of the half-value width of the ions, as has been described in German Pat. No. P 33 23 672.0 of July 1, 1983. The lateral wire thickness must be determined by a definite metallic grid mask. The problems arising in this regard are the accuracy of the metallic grid mask, and the looping of the grid wires to an outer contact for the control electrode. It must be taken into account that the lateral spacing in the grid must not exceed the value of twice the space charge zone obtained by an applied typical blocking voltage. Depending on the doping and voltage, these values are in the 10 μm range. At the same time, the thickness or depth of the bars of the mask must substantially exceed the penetration depth of the ions into the mask (which latter typically lies at 100 μm). Also, the grid mask must be rectangular exactly enough to eliminate half-shadow effects, and thus avoid short circuiting. Such masks having a mask depth-to-grid spacing ratio larger than 10 cannot be produced in practice. To overcome these problems, a vertical separation in addition to the lateral one, and beveling of the semiconductor wafer has been considered.

Consequently, the material thickness of the gride mask is selected to permit the ion to become implanted in the semiconductor substrate also through the bars of the grid mask so that two buried grid structures are produced in the semiconductor substrate which are vertically spaced from each other and laterally offset relative to each other. The peripheral edge of the semiconductor substrate is beveled at an acute angle measured from a top plane thereof and the control/switch electrodes formed on the underside of the semiconductor substrate. The ion implantation simultaneously produces buried conductive structures which extend parallel to the bevels, between the buried grid structure and the control/switch electrode. The bevel angle is 10° to 60°, preferably 10° to 30°. Tests with a similar system of SiO₂ with masks have shown that the separation in depth of the two buried gride structures has the desired dimension, namely within the detection limit of 4 μm. No short circuiting may therefore be expected between the two buried grid structures. The fabrication of a corresponding metallic grid mask is practicable without difficulties. To produce a semiconductor power component, particularly a gridistor, in accordance with the invention, a single masking step, and a beveling operation, are needed, so that the fabrication is very simple. At the same time, a self-adjusting connection to the control electrode is produced.

A further object of the invention is to provide a semiconductor power component, particularly a thyristor or gridistor, which comprises a buried grid structure and a control electrode which is conductively connected to the buried grid structure. The peripheral edge of the semiconductor substrate is beveled at an acute angle with respect to a top surface thereof and a control/switch electrode is provided on the underside of the semiconductor substrate. Two buried grid structures are provided in the semiconductor substrate which are vertically separated from each other and laterally offset relative to each other. The two buried grid structures are connected to the control/switch electrode by conductive structures which extend within the semiconductor substrate parallel to the beveled edge.

A still further object of the invention is to provide a method of fabrication which is simple, effective and economical, while providing a semiconductor component which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following the inventive method and device is explained in more detail with reference to an embodiment of a gridistor shown in the drawings in which:

FIGS. 1 to 4 are sequential vertical sectional view of the power device during the various steps of the process;

DESCRIPTION OF THE PREFERRED EMBODIMENTS

Figure 5:
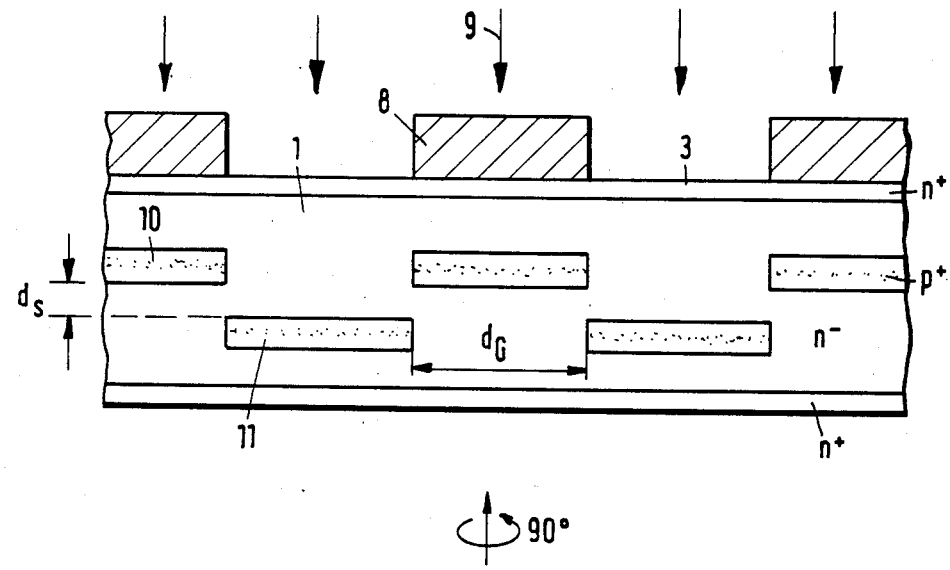
FIG. 5 is an enlarged partial view of the device during the ion implantation through a metallic grid mask, effected to produce two buried grid structures.
Figure 6:
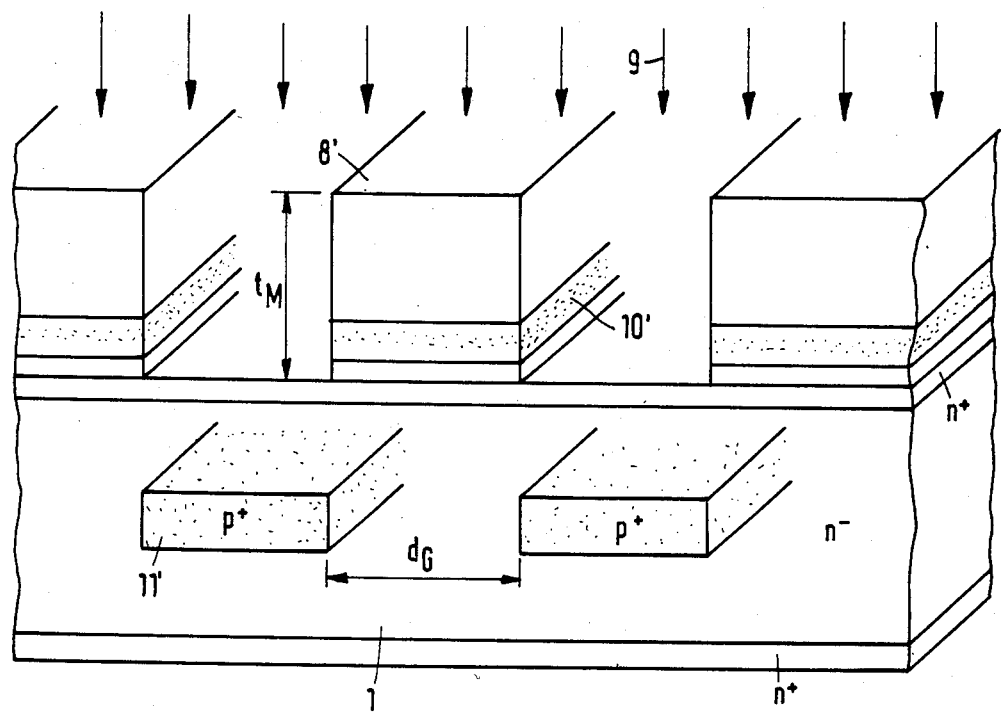
FIG. 6 is a perspective view of a semiconductor power device during the ion implantation of a single grid structure with the use of a metallic grid mask of large thickness or depth.

Referring to the drawings in particular, the invention illustrated and embodied therein includes a method of fabricating a power component shown sequentially in FIGS. 1, 2, 3 and 4, as well as a power component partially illustrated in FIGS. 5 and 6.

The n$^-$ doped starting material or semiconductor substrate 1 shown in FIG. 1 is silicon doped with phosphorus at a concentration of $10^{13}$/cm$^3$. The starting material is a cylindrical wafer having a diameter of ¾ of an inch (19 mm) and a thickness of about 900 $\mu$m. In the central area of the underside or under surface 2, and over the entire topside or top surface 3, n$^+$ contacts with a concentration of $10^{19}$/cm$^3$ and a penetration depth of 50 to 80 $\mu$m are diffused. Along the periphery of the underside 2, a boron doped p$^+$ contact 4 with a concentration of $10^{18}$/cm$^3$ to $10^{19}$/cm$^3$ and in the shape of a ring is established by diffusion. The next operation is metallizing of the top side 3 by vapor deposition, i.e. coating with a 50 to 100 $\mu$m metallic layer 5, particularly of aluminum.

This is followed, according to FIG. 2, by beveling of the circumferential edge or side 6 at an angle $\alpha$ ranging between 10° and 60°, preferably 10° to 30° measured from the plane of topside 3. The beveling gives the wafer 1 the shape of a truncated cone 7. The beveling is performed on a grinding machine. The component is then coated with a photoresist layer in the $\mu$-thickness range.

The next operation is producing of the grid pattern in metallic layer 5. To this end, as shown in FIG. 3 which is turned through 90° relative to FIG. 2, an array of strips is etched out of metallic layer 5 to form ribs 8. The spacing of the ribs and the thickness of each of the ribs (with the exception of the marginal ones near the beveled edge is 100 $\mu$m. The etching is performed in a plasm etching unit.

Finally, the next step of counterdoping ion implantation is performed according to FIG. 4 showing the wafer again turned through 90° relative to FIG. 3. To perform this step, the wafer is exposed in a high energy accelerator to a high energy ion radiation 9. The employed high energy accelerator is a Van-de-Graaf Cyclotron-Combination for heavy ions (VICKSI), operating in the range of 80 to 100 MeV and achieving an ion penetration depth of 200 $\mu$m, considering boron, as in the present example. The ion concentration is $10^{14}$/cm$^2$ to $10^{15}$/cm$^2$.

The counterdoping ion implantation produces within the semiconductor substrate 1 directly two buried grid structures 10, 11 which are vertically separated as well as laterally spaced from each other.

FIG. 5, which again is turned through 90° relative to FIG. 4, shows, in an enlarged partial sectional view of wafer 1, the individual wires or rows of each of the buried grid structures 10, 11 which extend spaced from each other in depth by a distance $d_S$ as desired, namely within the detection limit of 4 $\mu$m. The grid spacing $d_G$ corresponds to the width of ribs 8 of metallic mask 5 provided on the top of wafer 1.

The beveled edge 7 makes it possible to produce contacting connections 12, 13 between the two buried grid structures 10, 11 and the p$^+$ doped control of switch electrode 4. These connections are formed as self-adjusted connections directly by the ions penetrating into the substrate and becoming implanted in two parallel planes.

FIG. 6 shows the use of a metallic grid mask 8' having a depth dimension $t_M$ which substantially exceeds the penetration depth of the ions into the mask. Therefore, only one buried grid structure 11' can be produced with a spacing $d_G$ corresponding to the width of a rib 8' of the mask. The ions passing through ribs 8' are stopped by the material of the ribs and become implanted in the rib as a layer 10'. However, in the following process of the wafer, this implanted ion layer 10' is etched away along with the entire mask including ribs 8'.

Accordingly, the invention is a method of fabricating a semiconductor power component from a semiconductor substrate 1, having a top surface 3, an undersurface 2 and a side surface 6, comprising: forming a metallic grid mask 5, 8 on the top surface 3 and using a high energy accelerator to bury a grid structure 10, 11 directly into the substrate through the top surface by contradoping ion implantation.

The present invention also includes the semiconductor power component itself which comprises: a semiconductor substrate 1 having a top surface 3, an undersurface 2 and a side surface 6 which is beveled at an acute angle $\alpha$ with respect to the top surface; a control/switch electrode 4 on the undersurface 2; two buried grid structures 10, 11 each including a multitude of elements implanted in the substrate with the elements of one grid structure being vertically spaced from the elements of the other grid structure and the elements of the one grid structure being laterally spaced from the elements of the other grid structure; and a conductive structure implanted in the substrate and extending parallel to the beveled edges for connecting the control/switch electrode to the grid structures.

While specific embodimetns of the invention have been shown and described in detail to illustrate the application of the principles of the invention, it will be understood that the invention may be embodied otherwise without departing from such principles.

What is claimed is:

1. A process for preparing a semiconductor power component in a body of a semiconductor substrate having a top surface, a back surface and side surfaces, comprising:

forming a control/switch electrode on the back surface of the substrate;

bevelling the side surfaces of the semiconductor substrate so that the side surfaces form an acute angle with respect to the top surface of the semiconductor substrate;

forming a single metallic grid mask on the top surface of the semiconductor substrate, said grid mask comprising a multitude of spaced apart bars and being formed to have a thickness which is selected to permit ions irradiated by a high energy accelerator to pass through the top surface of the substrate both between the bars and through the bars of said grid mask; and burying by counterdoping, two grid structures which each have elements that are vertically spaced from each other and laterally offset relative to each other, directly into the substrate through the top surface using a high energy accelerator, said burying of said grid structures being through said mask to form a shallower one of said grid structures and through spaces between said mask to form a deeper one of said grid structures, said burying also implanting conductive structures through the bevelled side surfaces, which conductive structures extend parallel to the bevelled surfaces and function to connect the control/switch electrode to the buried grid structures.

2. A process according to claim 1, wherein the high energy accelerator is operated in the 80 to 100 MeV range.

3. A process according to claim 1, wherein a penetration depth of ions to bury the grid structures exceeds 10 $\mu$m.

4. A process according to claim 2, wherein a penetration depth of ions for burying the grid structures exceeds 50 $\mu$m.

5. A process according to claim 1, including burying said grid structures by operating the high energy accelerator at 80 to 100 MeV, a penetration depth of ions of the accelerator exceeding 50 $\mu$m, the material and the thickness of the grid mask being selected to permit ions to become implanted in the semiconductor substrate through the bars of the grid mask so that the two buried grid structures are produced in the semiconductor substrate which are vertically spaced from each other and laterally offset relative to each other.

6. A process according to claim 1, wherein the acute angle is between about 10° and 60°.

7. A process according to claim 5, wherein said bevelling of the side surfaces of the semiconductor substrate forms an acute angle of from 10° to 30°.

* * * * *

UNITED STATES PATENT OFFICE
CERTIFICATE OF CORRECTION

Patent No. 4,663,830      Dated May 12, 1987

Inventor(s) Fahrner et al

It is certified that error appears in the above-identified patent and that said Letters Patent are hereby corrected as shown below:

On the Title Page:

The name of Assignee should read as follows:
Hahn Meitner-Institut Berlin GmbH.

Signed and Sealed this

Fifth Day of April, 1988

*Attest:*

DONALD J. QUIGG

*Attesting Officer*     *Commissioner of Patents and Trademarks*